United States Patent
Morris, III (10) Patent No.: US 9,178,488 B2
(45) Date of Patent: Nov. 3, 2015

(54) SIMPLE AND MINIMALLY INVASIVE METHODS AND SYSTEMS FOR SENSING AND COMPUTING LOAD IMPEDANCE

(75) Inventor: Arthur S. Morris, III, Raleigh, NC (US)

(73) Assignee: WISPRY, INC., Irvine, CA (US)

( * ) Notice: Subject to any disclaimer, the term of this patent is extended or adjusted under 35 U.S.C. 154(b) by 453 days.

(21) Appl. No.: 13/426,575

(22) Filed: Mar. 21, 2012

(65) Prior Publication Data

US 2012/0293187 A1    Nov. 22, 2012

Related U.S. Application Data

(60) Provisional application No. 61/454,844, filed on Mar. 21, 2011.

(51) Int. Cl.
*G01R 27/26* (2006.01)
*G01R 27/02* (2006.01)
*H03H 7/38* (2006.01)
(Continued)

(52) U.S. Cl.
CPC .............. *H03H 7/38* (2013.01); *G01R 27/26* (2013.01); *H03H 7/40* (2013.01); *H03H 11/30* (2013.01); *G01R 27/02* (2013.01)

(58) Field of Classification Search
CPC ........... H03H 7/38; H03H 7/40; H03H 11/30; G01R 27/02; G01R 27/26
USPC ........... 324/600, 76.58, 76.19, 649, 691, 637, 324/522, 713; 333/17.1, 17.3
See application file for complete search history.

(56) References Cited

U.S. PATENT DOCUMENTS 5,442,296 A  *  8/1995  Schiek et al. ................. 324/601
6,208,945 B1     3/2001  Koda et al.
(Continued)

FOREIGN PATENT DOCUMENTS

CN     101261297 A     9/2008
EP     2 606 573       6/2013
(Continued)

OTHER PUBLICATIONS

J. De Mingo et al., "An RF electronically controlled impedance tuning network design and its application to an antenna input impedance automatic matching system," Microwave Theory and Techniques, IEEE Transactions, 2004 pp. 489-497, vol. 52.
(Continued)

*Primary Examiner* — Hoai-An D Nguyen
(74) *Attorney, Agent, or Firm* — Jenkins, Wilson, Taylor & Hunt, P.A.

(57) ABSTRACT

Systems and methods for direct load impedance computation for a two-port network are disclosed. For a two-port network connected between a first port and a second port, a method can include defining an equivalent PI network including a first equivalent network element in communication with the first port, a second equivalent network element in communication with the second port, and a third equivalent network element connected between the first port and the second port. A linear passive load can be connected to the second port of the two-port network, currents through the linear passive load, the second equivalent network element, and the third equivalent network element can be measured, and a load impedance of the linear passive load can be determined based on predetermined values of a voltage at the first port and a voltage at the second port.

17 Claims, 6 Drawing Sheets

(51) Int. Cl.
*H03H 7/40* (2006.01)
*H03H 11/30* (2006.01)

(56) References Cited

U.S. PATENT DOCUMENTS

| | | | |
|---|---|---|---|
| 6,946,847 B2* | 9/2005 | Nishimori et al. | 324/600 |
| 8,717,104 B1 | 5/2014 | Williams | |
| 8,797,119 B2 | 8/2014 | Gu | |
| 2003/0184319 A1 | 10/2003 | Nishimori | |
| 2006/0160501 A1 | 7/2006 | Mendolia | |
| 2007/0035356 A1* | 2/2007 | Ranta | 333/17.3 |
| 2007/0070737 A1 | 3/2007 | Fischer | |
| 2007/0276642 A1* | 11/2007 | Huszka | 703/14 |
| 2009/0066440 A1 | 3/2009 | Wai Po et al. | |
| 2009/0206962 A1 | 8/2009 | Chou et al. | |
| 2010/0073103 A1 | 3/2010 | Spears et al. | |
| 2010/0156552 A1* | 6/2010 | McKinzie et al. | 333/17.3 |
| 2010/0321086 A1* | 12/2010 | See et al. | 327/359 |
| 2011/0043298 A1* | 2/2011 | McKinzie, III | 333/17.3 |
| 2011/0063042 A1* | 3/2011 | Mendolia et al. | 333/17.3 |
| 2011/0175687 A1 | 7/2011 | Morris | |
| 2012/0095461 A1* | 4/2012 | Herscher et al. | 606/45 |
| 2012/0119842 A1 | 5/2012 | Gu | |

FOREIGN PATENT DOCUMENTS

| | | |
|---|---|---|
| EP | 2 689 257 | 1/2014 |
| JP | 2004-062407 | 2/2004 |
| KR | 10-2006-0039777 | 5/2006 |
| WO | WO 2007/103537 A2 | 9/2007 |
| WO | WO 2007/103537 A3 | 9/2007 |
| WO | WO 2008/010027 | 1/2008 |
| WO | WO 2012-024517 | 2/2012 |
| WO | WO 2012/129348 | 9/2012 |

OTHER PUBLICATIONS

P. Sjoblom et al. "An adaptive impedance tuning CMOS circuit for ISM 2.4-GHz band," Circuits and Systems I: Regular Papers, IEEE Transactions, 2005, pp. 1115-1124, vol. 52.

H. Song et al., "Automatic antenna tuning unit for software-defined and cognitive radio," Antennas and Propagation Society International Symposium, 2007 IEEE, 2007, pp. 85-88.

K. Brito De Brito et al, "Impedance Network for an Automatic Impedance Matching System," Microwave Conference, APMC, Asia-Pacific, 2007, pp. 1-4.

J.S Fu et al., "A ferroelectric-based impedance tuner for adaptive matching applications," Microwave Symposium Digest, IEEE MTT-S International, 2008, pp. 955-958.

A Van Bezooijen et al., "Adaptive Impedance-Matching Techniques for Controlling L Networks," Circuits and Systems I: Regular Papers, IEEE Transactions, 2010, pp. 495-505, vol. 57.

International Search Report and Written Opinion for PCT/US2011/048295 dated Dec. 27, 2011.

International Search Report and Written Opinion for Application No. PCT/US2012/030011 dated Oct. 23, 2012.

Notice of Allowance for U.S. Appl. No. 13/212,856 dated Jan. 21, 2014.

European Search Report for Application No. PCT/US2011/048295 dated Jun. 5, 2014.

Fidler, J.K. et al. "Determination of the Impedance Matching Domain of Impedance Matching Networks", IEEE Transactions on Circuits and Systems Part I: Regular Papers, IEEE Service Center, New York, NY, US, vol. 51, No. 10, pp. 2098-2106. Dated Oct. 1, 2004.

Chinese Office Action for Application No. 201180039868.7 dated Nov. 15, 2014.

European Search Report for Application No. PCT/US2012/030011 dated Aug. 7, 2014.

Sun Y et al. "Design method for impedance matching networks", IEEE Proceedings: Circuits Devices and Systems, Institution of Electrical Engineers, Stenvenage, GB, vol. 143, No. 4, Aug. 8, 1996. pp. 186-194.

Chinese Office Action for Application No. 2012/80022293.2 dated Dec. 17, 2014.

Chinese Search Report for Application No. 2012/80022293.2 dated Dec. 9, 2014.

European Intent to Grant for Application No. 11818793.9 dated May 18, 2015.

Chinese Office Action for Application No. 201180039868.7 dated Jun. 30, 2015.

Chinese Office Action for Application No. 201280022293.2 dated Aug. 12, 2015.

* cited by examiner

SIMPLE AND MINIMALLY INVASIVE METHODS AND SYSTEMS FOR SENSING AND COMPUTING LOAD IMPEDANCE

CROSS REFERENCE TO RELATED APPLICATION

The present application relates and claims priority to U.S. Patent Application Ser. No. 61/454,844, filed Mar. 21, 2011, the disclosure of which is incorporated herein by reference in its entirety.

TECHNICAL FIELD

The subject matter disclosed herein relates generally to systems and methods for operating electronic devices. More particularly, the subject matter disclosed herein relates to systems and methods for sensing and computing a load impedance for a tunable matching network.

BACKGROUND

Tunable matching networks are expected to play an important role in the realization of adaptive and reconfigurable radio front-end architectures. One particular example is the compensation of handset antenna impedance mismatch loss caused by user proximity effects using tunable antenna impedance matching networks.

Different matching network topologies have been reported in the literature. Basic L-type networks are able to achieve conjugate matching over a limited Smith chart region. On the other hand, pi-networks provide an extra degree of freedom that enables conjugate matching over a substantially wider impedance range. In the ideal case where the component values range is unbounded [0,∞], pi-networks can provide complete Smith Chart coverage and the component values for perfect conjugation matching can be calculated by using approaches known in the art.

The finite nature of the component tunable range is due to practical implementation limitations such as parasitic influences and component properties. For a matching network with finite component tuning ranges the perfect conjugate match can be achieved only if the load impedance lays within the matching domain. In reality, the network component available range may be predetermined and the unknown load impedance may often be located outside of the matching domain. Therefore, in practical impedance tuners with finite component tuning range, where a perfect conjugation match may not exist, optimization techniques have been commonly used to minimize the reflected signal (e.g., minimize VSWR). Different optimization approaches, such as simplex and single step, genetic method, or simulated annealing have been used to minimize the network input reflection coefficient as much as possible or at least down to an acceptable level. These optimization methods search for the right component tuning setting through an iterative process, consuming a considerable amount of time to reach the tuning goal. In addition, depending on the optimizer choice and its initial settings, there is a risk of converging into local minima.

Thus it is desirable to develop a deterministic approach to directly compute the final component tuning setting for the impedance match in order to reduce the tuning time and avoid the intermediate tuning states. A key aspect for such a tuning approach is a method to determine the load impedance, which also determines the equivalent admittance and complex reflection coefficient. It is desirable that determining the load determination is accomplished with minimal added loss, size and complexity.

SUMMARY

In accordance with this disclosure, systems and methods for direct load impedance computation for a two-port network are provided. In one aspect, for a two-port network connected between a first port and a second port, the method can comprise defining an equivalent PI network comprising a first equivalent network element in communication with the first port and having a first admittance, a second equivalent network element in communication with the second port and having a second admittance, and a third equivalent network element connected between the first port and the second port and having a third admittance. A linear passive load can be connected to the second port of the two-port network, currents through the linear passive load, the second equivalent network element, and the third equivalent network element can be measured, and a load impedance of the linear passive load can be determined based on predetermined values of a voltage at the first port and a voltage at the second port.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

The present subject matter provides systems and methods that can be used for sensing and computing a load impedance that is present at one port of a network. In the case that the two-port network is tunable (particularly in the case of a load or impedance tuner), this load information can be used together with an appropriate algorithm to control the overall circuit response. For the tuner case, this would be to set the tuner to maximize delivered power into the measured load. In one aspect, the systems and methods can be based on closed-form formulas and a direct calculation procedure. Although the term "load impedance" is used herein, those having ordinary skill in the art will recognize that the systems and methods disclosed herein can be applied to determine the load impedance, admittance, and/or the reflection coefficient.

It is acknowledged that in the case of a matching network without loss, tuning for achieving conjugation match or minimizing the reflection coefficient means maximizing the power transfer to the load. In reality, however, the matching network has a certain amount of loss, and the minimization of the reflection coefficient does not necessarily result in maximization of power transfer. Thus, where the final matching goal is maximizing the power delivered to the load, any impedance matching approach or method based on (or partially based on) minimizing the input reflection coefficient only has good accuracy for lossless and low loss matching networks or tuners.

The scope of application of this method is not exclusive to antenna impedance tuning control as it can, for example and without limitation, be used for tunable or non-tunable matching network design or performance analysis to replace an optimization tool.

This approach also avoids the need for external sensor elements and thus provides lower cost, size and loss than alternative approaches.

In one aspect, the disclosed systems and methods can be used to evaluate and adjust the performance of a tuner based on the input voltage standing wave ratio (VSWR) and transducer gain and/or relative transducer gain. The VSWR at the input port of the tuner is related to its input reflection coefficient ($\Gamma_{in}$) as $$VSWR_{in} = \frac{1 + |\Gamma_{in}|}{1 - |\Gamma_{in}|} \quad (1)$$

The impedance match can be achieved by minimizing the magnitude of reflection coefficient or equivalently the VSWR. In the case of perfect match, the magnitude of the reflection coefficient is zero and VSWR is equal to 1. On the other hand, the transducer gain ($G_T$) of the tuner assuming a matched source is defined as the ratio of the power delivered to the load to the available power from the source, and can be expressed as $$G_T = \frac{|S_{21}|^2 (1 - |\Gamma_L|^2)}{|1 - S_{22}\Gamma_L|^2} \quad (2)$$

where $|S_{21}|^2$ and $S_{22}$ are the insertion loss and output reflection coefficient, respectively, of the tuner. $\Gamma_L$ is the load reflection coefficient. The relative transducer gain is the ratio of the $G_T$ to the transmission loss $(1-|\Gamma_L|^2)$ caused by the mismatched load impedance. The relative transducer gain ($\Delta G_T$) is the $G_T$ improvement achieved by introducing the tuner and it can be expressed as:

$$\Delta G_T = \frac{|S_{21}|^2}{|1 - S_{22}\Gamma_L|^2} \quad (3)$$

Figure 1A:
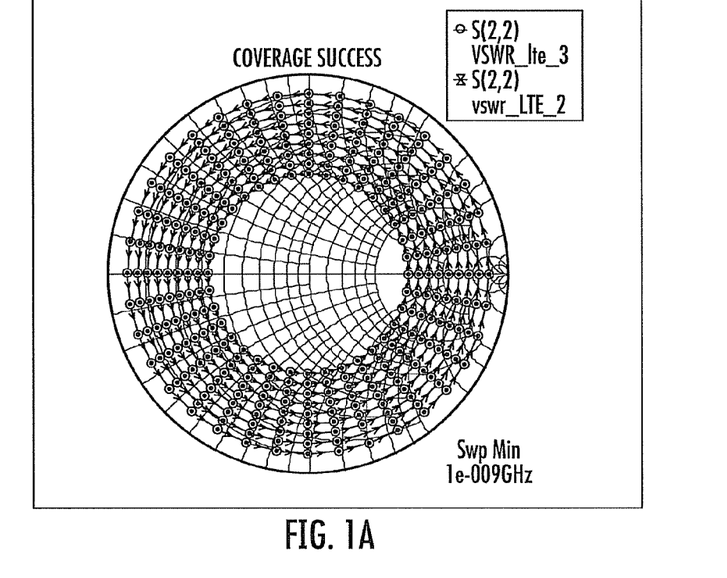
FIG. 1A is a chart illustrating coverage success over the Smith chart for a tuning method that minimizes the voltage standing wave ratio.
Figure 1B:
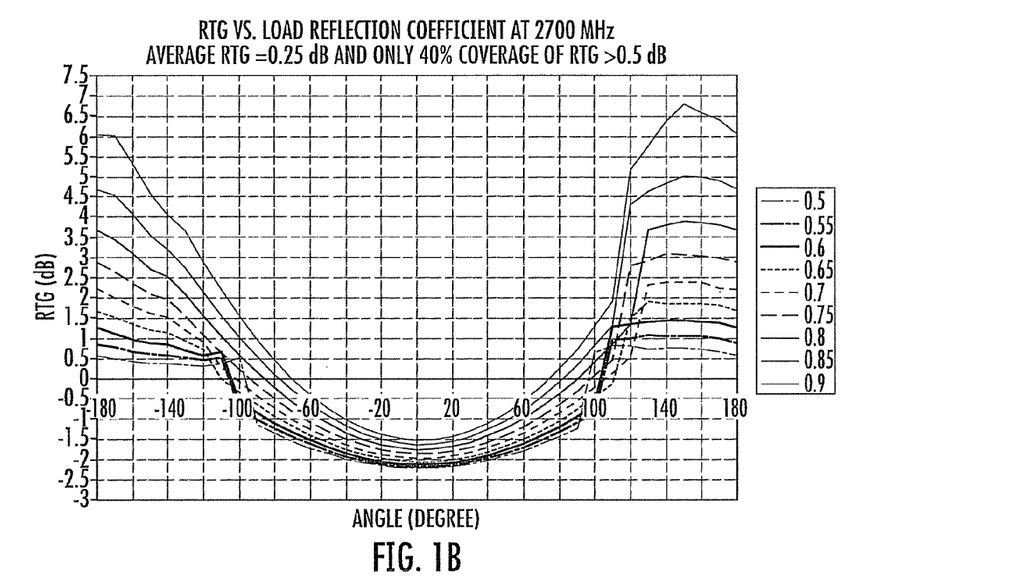
FIG. 1B is a graph illustrating the power delivered by a network tuned based on minimization of the voltage standing wave ratio.
Figure 2A:
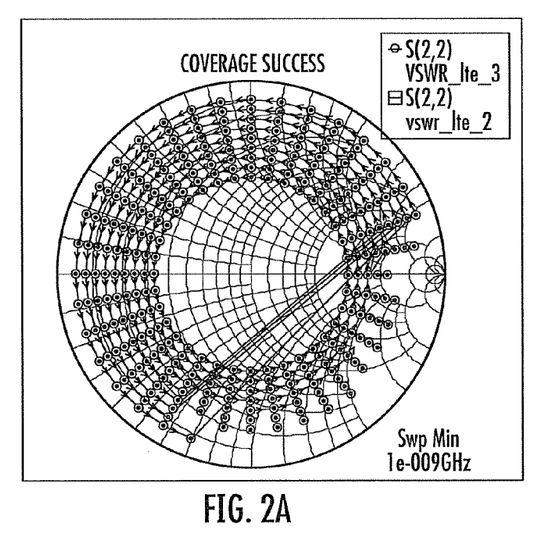
FIG. 2A is a chart illustrating coverage success over the Smith chart for a tuning method that maximizes the transducer gain.
Figure 2B:
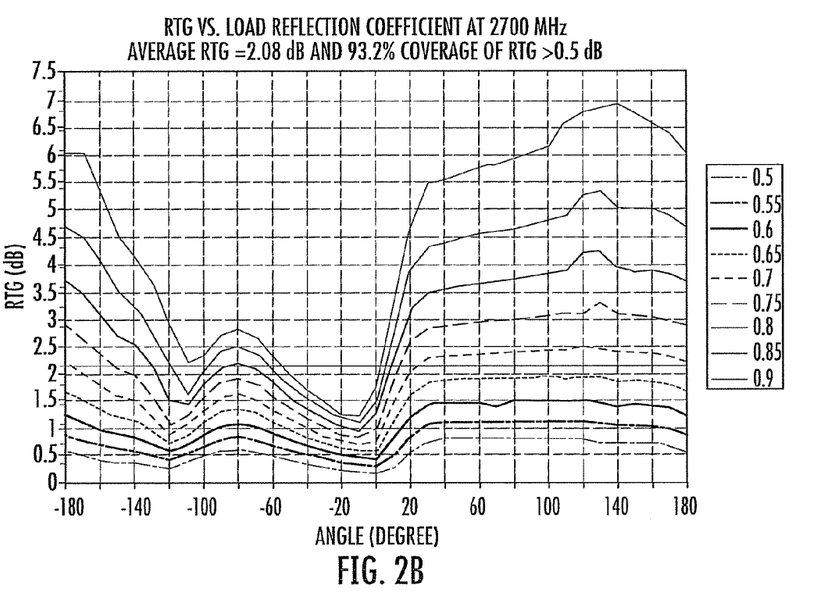
FIG. 2B is a graph illustrating the power delivered by a network tuned based on maximization of the transducer gain.
Figure 3:
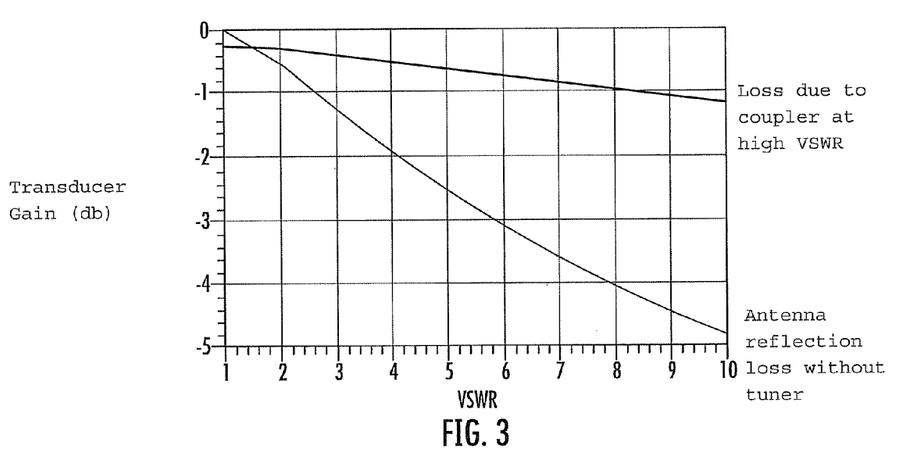
FIG. 3 is a graph showing the effective loss of a 20 dB directional coupler that has 0.2 dB of 50-ohm loss versus antenna VSWR after being tuned by an ideal lossless tuner.
Figure 4A:
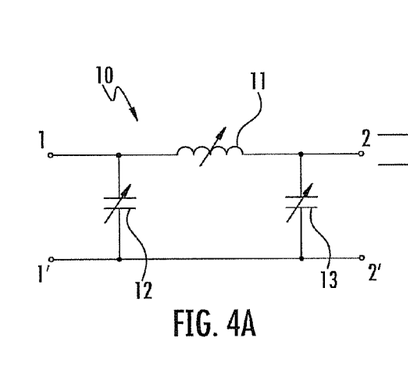
FIG. 4A is a circuit topology for an ideal tunable low-pass pi-network.
Figure 4B:
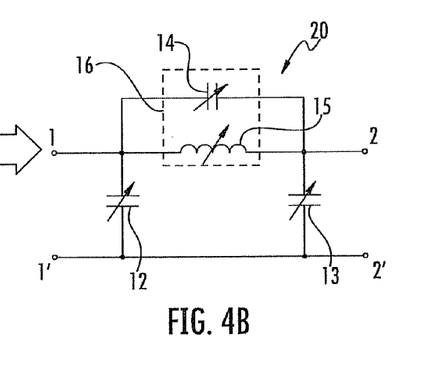
FIG. 4B is a circuit topology for an equivalent circuit of practical pi-network tuner with fixed inductor and tunable capacitors.

Maximizing the $G_T$ or $\Delta G_T$ for a given load impedance (i.e., delivering maximum power to the load) is the primary function of a tuner. Minimizing the VSWR will not always provide the highest $G_T$ in some situations since a realizable tuner's internal loss lowers the VSWR while also lowering the $G_T$. To demonstrate this, as shown in FIGS. 1A and 1B, where the VSWR is measured between the tuner and a radio to which the tuner is connected, minimizing the VSWR can provide a best match for any given frequency, but it may not yield maximum delivered power. Conversely, if a system having the same configuration is tuned to maximize $G_T$ as shown in FIGS. 2A and 2B, the result can be a worse match for at least some frequencies, but with lower losses and thus greater average power output. Thus sensing with a coupler between the radio and the tuner is not optimal. Moving the sensor to a position between the tuner and the antenna may enable more accurate tuner setting for maximum power transfer, but such a configuration has its own deficiencies. Specifically, for example, referring to FIG. 3, the sensor would effectively sit in a resonant tank formed by the tuner and antenna, which would result in even greater power losses due to resonant currents flowing in the coupler. In fact, losses can be most effectively minimized by incorporating any sensing components into the tuner itself, ideally without any directional couplers losses As an example, an ideal tunable low-pass pi-network topology, generally designated 10, is shown in FIG. 4A using a tunable inductor 11 connected between a first node 1 and a second node 2, a first tunable capacitor 12 having a first capacitance $C_1$ connected to first node 1, and a second tunable capacitor 13 having a second capacitance $C_2$ connected to second node 2. In practical applications, however, a capacitor-bridged pi-network tuner, generally designated 20, can be implemented as shown in FIG. 4B. In this configuration, because tunable inductors are generally unavailable, a third tunable capacitor 14 and a first inductor 15 having a first inductance L can be connected in parallel between first node 1 and second node 2 to serve as an equivalent element, generally designated 16, having an equivalent series resistance $R_e$ and an equivalent series inductance $L_e$. In this case, the series equivalent inductance tuning can be achieved by adjusting a third capacitance $C_3$ third tunable capacitor 14. As a result, the series equivalent inductance $L_e$ value is determined by $$L_e = \frac{L}{1 - \omega^2 L C_3} \quad (4)$$

where $\omega$ equal to $2\pi f$ is the angular frequency in (rad/s). In FIG. 4B, first and second capacitors 12 and 13 can represent high-Q tunable capacitors having a finite tuning range $$C_{k,min} \leq C_k \leq C_{k,max}, \quad (5)$$

where k={1,2, or 3}.

However, any two-port having a non-singular Y-matrix can be utilized in this impedance sensing method since it does not depend on the details of the internal circuit. Note that, as long as the two-port parameters are known, the load impedance can, be calculated. This is true even if the network is tuned using tunable elements.

Thus, although the discussion above refers to network circuit topologies shown in FIGS. 4A and 4B, it should be understood that the present systems and methods can be applied to any two-port circuit as long as the $Y_{21}$ and $Y_{22}$ of the circuit are not infinite. For example, the present systems and methods would have limited utility for a two-port for the limiting case of a zero-length transmission line since the input and output voltages would always be the same.

Figure 5:
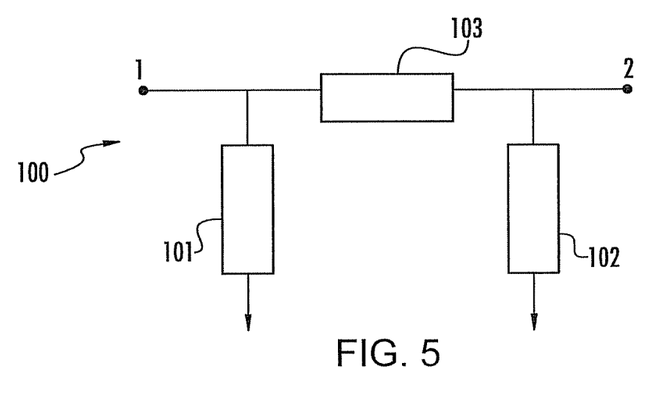
FIG. 5 is a circuit topology for a two-port matching network according to an embodiment of the present subject matter.

Accordingly, the impedance computation generally does not require the network to have any particular form internally. In this regard, although the Pi network is a good way to interpret the Y-parameters, it is to be understood that the Y-parameters (or S-parameters, Z-parameters, or any other linear parameter behavior of the load) can be determined for any two-port network just as well. Stated otherwise, for a given two-port network, generally designated 100 in FIG. 5, as long as properties are known for at least a first tunable shunt element 101, a second tunable shunt element 102, and a first series element 103, a tuning method such as that discussed hereinabove can be used to determine the required component values for two-port network 100 to best match any load impedance on the Smith chart at a given frequency.

Figure 6:
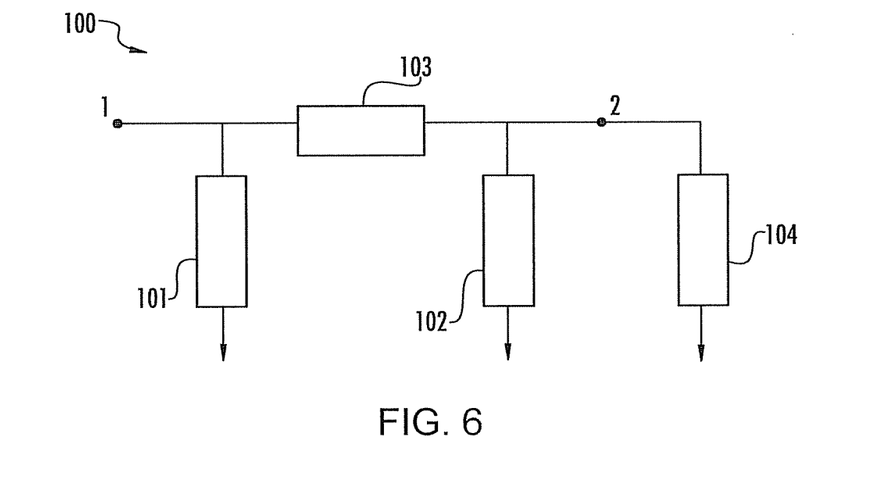
FIG. 6 is a circuit topology for the two-port network shown in FIG. 14 connected to an arbitrary linear passive load.

For instance, the tuning values can be determined based on properties of the components and an arbitrary linear passive load. Referring to FIG. 6, first tunable shunt element 101 can have a first admittance value $Y_1=Y_{11}+Y_{21}$, second tunable shunt element 102 can have a second admittance value $Y_2=Y_{22}+Y_{21}$, and first series element 103 can have a series admittance value $Y_s=-Y_{21}$. A linear passive load 104 can be connected to two-port network 100 and can define a load admittance $Y_L$. From the complex ratio of the node voltages and known network element values, the complex load impedance may be obtained:

$$I_L = I_s - I_2 \quad (6)$$

$$V_2 Y_L = (V_1 - V_2) Y_s - V_2 Y_2 \quad (7)$$

$$Y_L = (V_1/V_2 - 1) Y_s - Y_2 \quad (8)$$

$$Z_L = 1/Y_L \quad (9)$$

where $I_L$, $I_s$, and $I_2$ are the currents through linear passive load 104, series element 103, and second shunt element 102, respectively, and $V_1$ and $V_2$ are the voltages determined at first and second nodes 1 and 2, respectively. It should be noted that this approach for determining the load impedance/admittance can only be applied to tunable two-port networks if they have repeatable open-loop settings such that the two-port small signal parameters are accurate and reproducible.

With $Y_L$ determined, if two-port network 100 is a matching network or filter, it may be adjusted accordingly to provide the desired response. Specifically, for a matching network, this adjustment can involve applying the tuning method outlined hereinabove. As two-port network 100 is varied, the computed load impedance should not shift if the variation in two-port network is properly captured in the Y-parameter response. Only an actual load change will yield such a response. Alternatively, if characteristics of linear passive load 104 are known, information about two-power network 100 can be deduced.

Regardless of the specific form of the network, the principle remains that the tuner circuit can be used as the sensor for the closed loop instead of requiring that an external sensor be provided. To make this possible, the tuner circuit can be reproducible so its properties are known to a reasonable tolerance for any given tuned state.

Accordingly, the present systems and methods can broadly involve at least the features of determining the two-port behavior of a reproducible open-loop network for any setting, determining the voltage ratio and phase difference between output and input ports at a given time, and determining the impedance of a load at that time from this information. Specifically, for example, determining the impedance of the load can be accomplished using a method such as described above to compute the tuner setting(s). This determination can be done once and set without iteration, or calculations of the voltage ratio and phase difference between output and input ports at a given time can be performed repeatedly at a rate necessary to keep up with environmental change (but no optimization is required).

APPLICATION EXAMPLES

A. Determining the Match Tuning Setting for an Unknown Antenna Load Impedance

This sensor approach can be used to determine the antenna feed impedance. This impedance can be fed into an analytic tuning method to determine the component setting of the matching network different usage scenarios at each frequency, operating mode and environmental loading (head, hand, metal table, etc.) condition.

Figure 7:
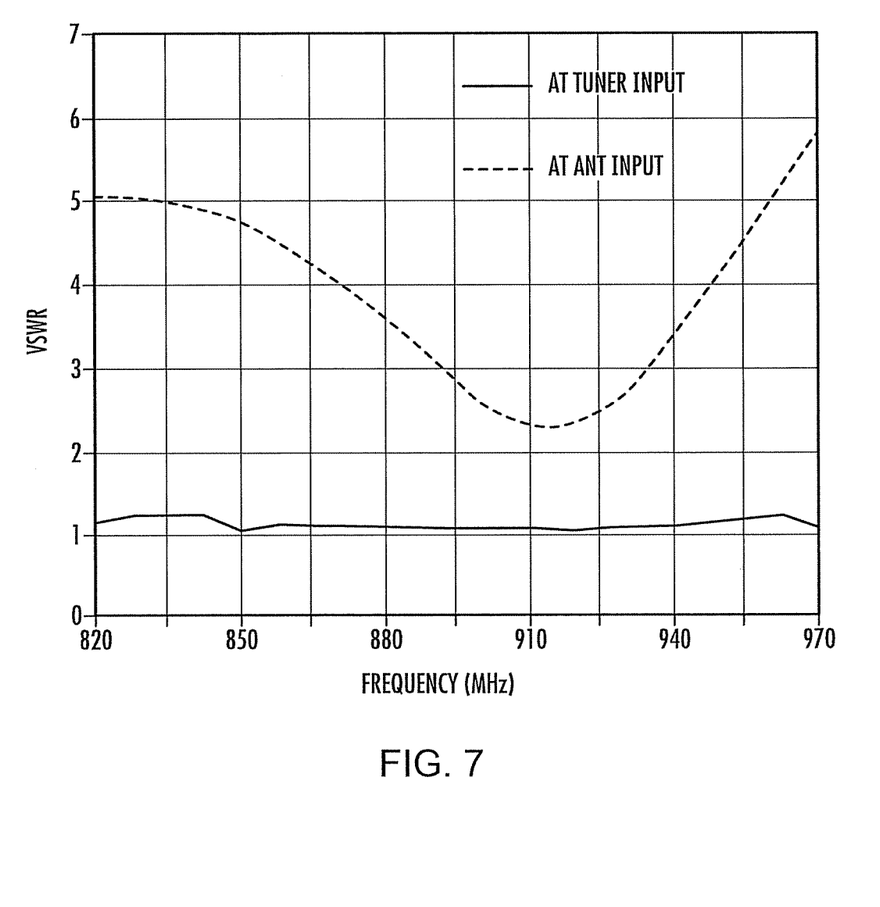
FIG. 7 is a graph of VSWR versus frequency of a given antenna impedance with and without using the tuner.

FIG. 7 presents the VSWR versus frequency curves for a mobile phone antenna before and after using a tuner. In this example, the tuner as shown in FIG. 4B containing a series inductance L=6.8 nH, and capacitor values $C_{1,min}=C_{2,min}=0.8$ pF, $C_{1,max}=C_{2,max}=5$ pF, $C_{3,min}=0.25$ pF, and $C_{3,max}=4$ pF can be employed as the impedance matching network, and it can be tuned by means of the present method of sensing the load impedance. From FIG. 7, it can be seen that the input maximum VSWR after using the tuner is reduced from a VSWR=5.8:1 to a VSWR of 1.2:1 over the frequency range from 820 MHz to 970 MHz. The relative transducer gain $\Delta G_T$ and resulting tunable capacitor settings $C_1$–$C_3$ at frequencies 850, 880, 925, and 970 MHz, are given in Table 1.

If instead of a continuous capacitance setting, the tunable capacitors are adjusted in discrete steps of 0.125 pF, the matching performance degradation is shown in Table 2. The $\Delta G_T$ degrades only 0.1 dB or less, and the VSWR increases 0.1. Usually, in this frequency range the matching performance is not highly sensitive to component value quantization. The capacitance step size for commercially available surface mount chip capacitors may be larger than this particular example.

TABLE 1

Matching performance and tunable capacitor settings considering matching network with continuous capacitance

| Freq (MHz) | VSWR | $\Delta G_T$ (dB) | $C_1$ (pF) | $C_2$ (pF) | $C_3$ (pF) |
|---|---|---|---|---|---|
| 850 | 1.04 | 1.63 | 5 | 0.80 | 2.45 |
| 880 | 1.10 | 1.17 | 0.8 | 2.86 | 2.66 |
| 925 | 1.05 | 0.55 | 0.8 | 2.84 | 1.73 |
| 970 | 1.06 | 2.16 | 5 | 0.80 | 1.45 |

TABLE 2

Matching performance and tunable capacitor settings considering matching network with discrete capacitance steps.

| Freq (MHz) | VSWR | $\Delta G_T$ (dB) | $C_1$ (pF) | $C_2$ (pF) | $C_3$ (pF) |
|---|---|---|---|---|---|
| 850 | 1.11 | 1.55 | 5 | 0.875 | 2.5 |
| 880 | 1.13 | 1.11 | 0.875 | 2.875 | 2.75 |
| 925 | 1.08 | 0.54 | 0.875 | 2.875 | 1.75 |
| 970 | 1.16 | 2.06 | 5 | 0.875 | 1.5 |

B. Control Method For Closed Loop Impedance Matching

Figure 8:
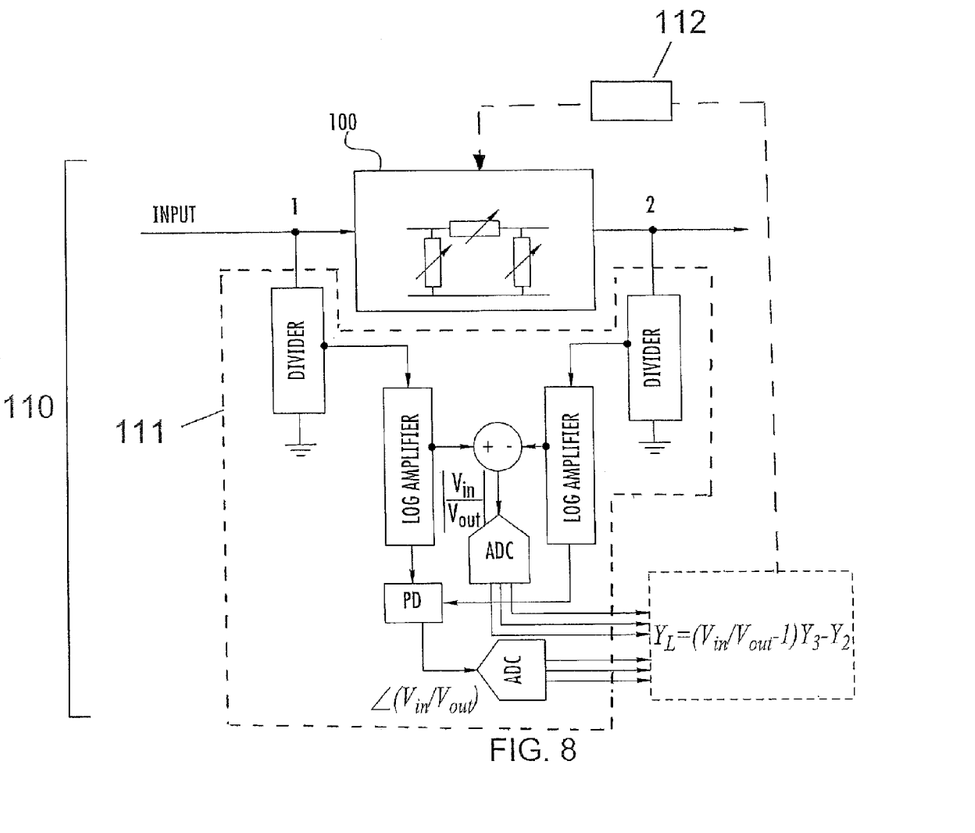
FIG. 8 is a conceptual block diagram of a closed loop impedance matching control system according to an embodiment of the present subject matter.

Since the method deterministic nature provides much faster tuning settings than its optimizer counterpart, it is a good candidate to be used as a control method for closed loop dynamic antenna impedance match control. A conceptual block diagram of the closed loop impedance matching system utilizing this method is depicted in FIG. 8.

The objective of this loop system implementation is the determination of the antenna complex input impedance through the measurement of input and output voltages, $V_1$ and $V_2$ as described above. Similarly to the relationship discussed above, the antenna impedance $Z_L$ can be determined by the initial values $Y_2$ and $Y_S$ in two-port network 100 and the voltages $V_1$ and $V_2$ by using the following expression $$Z_L = \frac{1}{(V_1/V_2 - 1)Y_S - Y_2} \quad (10)$$

This type of complex impedance determination using both voltage and current measurements has been proposed for an L-type matching network.

Because a two-port network modeled as an equivalent pi-network provides a different topology (i.e., no series component is connected directly to antenna to measure its current), however, the impedance determination is based only on two node voltage measurements. The analytical tuning method can then be applied to calculate the required tunable capacitor values $C_1$–$C_3$ for the best match as long as the instant antenna impedance is known.

In this regard, a sensor, generally designated 110, can be provided in communication with first and second nodes 1 and 2. For example, as shown in FIG. 8, sensor 110 can comprise high ratio voltage dividers to minimize RF loading, log amplifiers, phase detectors, and A/D converters, which can together serve as a sensing circuit, generally designated 111, for determining a first voltage $V_1$ at first port 1 and a second voltage $V_2$ at second port 2. Sensing circuit 111 can be integrated into the tuner chip (e.g., built in CMOS). In addition, sensing circuit 111 can measure with low duty cycle to minimize current and power consumption. In this configuration, once first and second voltages V1 and V2 are determined by sensing circuit 111, a controller 112 can calculate tuning settings for two-port network 100 as discussed above and tune the components of two-port network 100 accordingly.

The presently disclosed subject matter provides systems and tuning methods that can be very effective in determining the optimum tuning settings for any tuner with finite tuning range capacitors. Perfect match solutions can be obtained if the tuning values derived from the tuning method are within the available tuning range. Otherwise, the present systems and methods can achieve a best possible match solution, and thus such a method represents a practical and a useful method for closed feedback control of tuners.

Methods as described herein can be extended to any tuner network tuner topology that have a linear two-port response that can be transformed into an equivalent pi-network topology.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A method for direct load impedance determination for a two-port network comprising:
   connecting the two-port network between a first port and a second port;
   determining component values for an equivalent PI network that models a linear two-port response of the two-port network, the equivalent PI network comprising a first equivalent network element in communication with the first port and having a first admittance to ground, a second equivalent network element in communication with the second port and having a second admittance to ground, and a third equivalent network element connected between the first port and the second port and having a third admittance;
   connecting a linear passive load to the second port of the two-port network;
   measuring a first voltage at the first port and a second voltage at the second port; and
   determining a load impedance of the linear passive load based on a relationship of the load impedance to the first voltage, the second voltage, the first admittance, the second admittance, and the third admittance.

2. The method of claim 1,
   wherein the method further comprises adjusting one or more of the first admittance, the second admittance, or the third admittance to minimize a voltage standing wave ratio of the two-port network along with the load impedance.

3. The method of claim 1, wherein measuring a first voltage at the first port and a second voltage at the second port comprises connecting one or more of high ratio voltage dividers, log amplifiers, phase detectors, or A/D converters to the first port and to the second port.

4. The method of claim 1, wherein the relationship comprises:

$$Z_L^{-1} = (V_1/V_2 - 1)Y_S - Y_2,$$

where $Z_L$ is the load impedance, $V_1$ is the voltage at the first port, $V_2$ is the voltage at the second port, $Y_S$ is the third admittance, and $Y_2$ is the second admittance.

5. The method of claim 1,
   wherein the method further comprises adjusting one or more of the first admittance, the second admittance, or the third admittance provide a desired matching response.

6. The method of claim 5, wherein adjusting one or more of the first admittance, the second admittance, or the third admittance comprises applying an analytical tuning method to one or more of the first equivalent network element, the second equivalent network element, and/or the third equivalent network element with values derived from the sensed load impedance.

7. The method of claim 1, wherein the method further comprises adjusting one or more of the first admittance, the second admittance, or the third admittance to maximize a relative transducer gain of the two-port network into the sensed load impedance.

8. A system for direct load impedance determination for a two-port network comprising:
the two-port network being connected between a first port and a second port, the two-port network having a linear two-port response that can be transformed into an equivalent PI network topology comprising a first equivalent network element in communication with the first port and having a first admittance, a second equivalent network element in communication with the second port and having a second admittance, and a third equivalent network element connected between the first port and the second port and having a third admittance;
a linear passive load connected to the second port of the two-port network;
whereby the system is configured to measure a first voltage at the first port and a second voltage at the second port and configured to determine a load impedance of the linear passive load based on relationships of the first voltage, the second voltage, the first admittance, the second admittance, and the third admittance.

9. The system of claim 8, comprising a controller configured to adjust one or more of the first admittance, the second admittance, and the third admittance to achieve a desired value for a transducer gain and/or voltage standing wave ratio (VSWR) at the sensing frequency.

10. The system of claim 8, wherein the two-port network comprises a tuner.

11. The system of claim 8, wherein the system comprises a sensor.

12. The system of claim 11, wherein the sensor comprises a sensing circuit configured to measure the first voltage and the second voltage and to determine the load impedance of the linear passive load.

13. The system of claim 12, wherein the sensing circuit comprises one or more of high ratio voltage dividers, log amplifiers, phase detectors, or A/D converters.

14. The system of claim 12, wherein the sensing circuit is integrated into a common semiconductor die as the tunable elements of the two-port network.

15. The system of claim 9, wherein the controller is configured to adjust one or more of the first admittance, the second admittance, and the third admittance to achieve a desired value for a transducer gain and/or VSWR at a different frequency than a sensing frequency based on the impedance at the sensing frequency.

16. The system of claim 9, wherein the controller is configured to adjust one or more of the first admittance, the second admittance, and the third admittance to achieve a desired value for a transducer gain and/or VSWR at two or more frequencies based on the load impedance at a sensing frequency.

17. The system of any of claims 9 to 16, wherein the controller is integrated into a common semiconductor die as the tunable elements of the two-port network.

* * * * *